United States Patent [19]

Lenhardt

[11] 4,379,264

[45] Apr. 5, 1983

[54] BROADBAND PHASE SHIFTER

[75] Inventor: Wilfried K. Lenhardt, Richardson, Tex.

[73] Assignee: Mobil Oil Corporation, New York, N.Y.

[21] Appl. No.: 176,896

[22] Filed: Aug. 11, 1980

[51] Int. Cl.³ .............................................. G01R 25/04
[52] U.S. Cl. ...................................... 328/24; 328/155; 307/512
[58] Field of Search ........................ 328/155, 24, 166; 307/511, 512

[56] References Cited

U.S. PATENT DOCUMENTS

| 3,475,626 | 10/1969 | Holzman et al. | 328/155 |
| 4,087,737 | 5/1978 | De Gennaro | 307/511 |
| 4,297,641 | 10/1981 | Sterzer | 328/155 |

OTHER PUBLICATIONS

U.S. Comm–NBS Tech. Note No. 237, Apr. 10, 1964 "A Variable Phase Shifter" by E. L. Smith.

Primary Examiner—John S. Heyman
Attorney, Agent, or Firm—Charles A. Huggett; Michael G. Gilman; Frank J. Kowalski

[57] ABSTRACT

An electronic circuit which operates as a phase shifter is disclosed which uses a phase inversion principle. The circuit is broadband and may be either manually or electronically operated.

15 Claims, 1 Drawing Figure

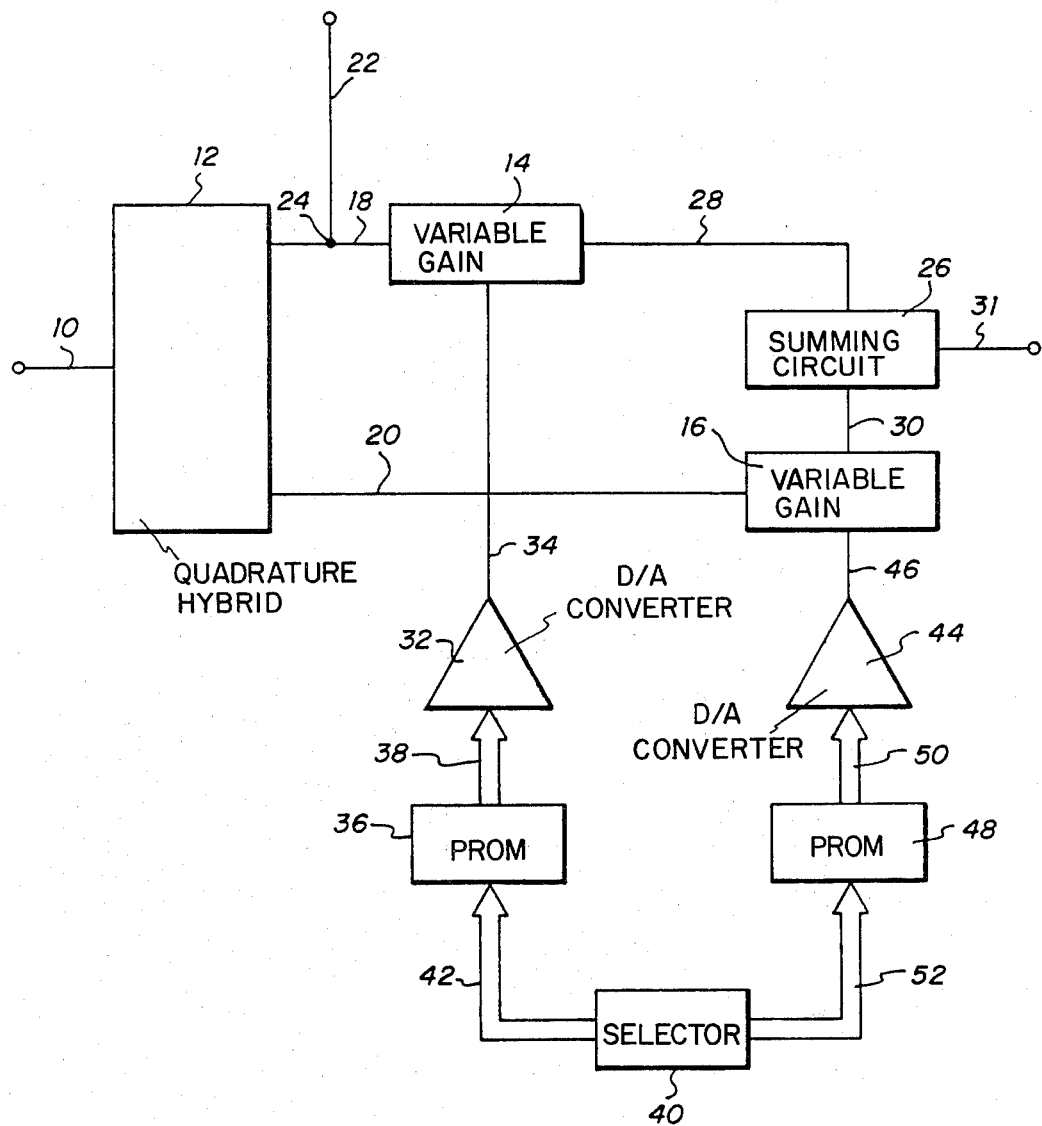

BROADBAND PHASE SHIFTER

BACKGROUND OF THE INVENTION

The present invention pertains to electronic phase shifting circuits and more particularly to Broadband Phase Shifting Circuits. The present invention accomplishes a phase shift by a phase inversion technique which permits a phase shift from 0 to 360 degrees without adding undesirable harmonics.

The application of a phase shifting circuit is necessary whenever a synchronous receiver is used, such as those used in oil exploration techniques such as the receiver portion of a magnetic resonance transmitter/receiver system. The frequency conversion circuits generally have three deficiencies.

Phase shifters, in general, are narrow band. That is, a phase shifter operates reliably only over a limited frequency range. The frequency range is normally limited to a 10 percent bandwidth.

Second, prior art variable length transmission line phase shifting circuits are also generally limited in the phase shift which they can provide at lower frequencies with managable equipment. Variable length transmission line phase shifting circuits rely on the difference in path length to accomplish a phase shift between signals. Thus to achieve a significant phase shift, at a low frequency, the difference in path lengths must be extremely large.

Third, phase shifting circuits operate on a frequency conversion principal which provides additional harmonic frequencies of the frequency desired. This means that higher harmonics of the desired frequency will be produced to such an extent that the higher harmonics will provide inaccuracies in the measured signals. This requires the addition of electrical filters, adding costs over and above the costs of the phase shifting circuit itself.

Thus, phase shifting circuits available today are very limited not only in the bandwidth in which they will operate but also in the phase shift which the circuit will provide. In addition to the bandwidth limitations, phase shifting circuits also add inaccuracy to measurements by the nature of the principal on which they operate.

SUMMARY OF THE INVENTION

An electronic circuit for providing a phase shift on an incoming signal is disclosed which operates on a phase inversion technique. An incoming signal is received and broken down into two components, 90 degrees out of phase with each other. These two signals are gain varied by various amounts and combined to produce a signal which is shifted from the original incoming signal. By controlling the gain and signal polarity in the two variable gain devices a phase shift from 0 to 360 degrees may be obtained. The phase shifting circuit will provide a phase shift of from 0 to 360 degrees to incoming signals over an extremely broad bandwidth without adding any higher harmonics to the output signal.

BRIEF DESCRIPTION OF THE DRAWINGS

The attached FIGURE is a block diagram of a phase shifting circuit.

DESCRIPTION OF THE PREFERRED EMBODIMENT

The attached FIGURE illustrates a phase shifting circuit having incoming line 10 connected to quadrature hybrid circuit 12 which is connected to variable gain devices 14 and 16 through conductors 18 and 20, respectively. Conductor 22 is connected to conductor 18 at node 24. Variable gain device 14 is connected to summing circuit 26 through conductor 28 and variable gain device 16 is connected to summing circuit 26 through conductor 30. The output of summing circuit 26 is fed to a sychronous receiver or the like (not shown) through conductor 31. Control current for variable gain device 14 is provided by digital-to-analog converter 32 through conductor 34. Digital-to-analog converter 32 receives a digital control current from programmable read only memory (PROM) 36 through connection 38. PROM 36 receives a phase shift command from phase shift selector 40 through connection 42. Variable gain device 16 receives a gain control current from digital-to-analog converter 44 through conductor 46. Programmable read only memory (PROM) 48 controls digital-to-analog converter 44 through connection 50. PROM 48 is controlled by phase shift selector 40 through connection 52.

Quadrature hybrid 10 may be of any type which divides the incoming signal into two signals 90 degrees out of phase with each other, however Merrimac QH-7-36 is preferred. Variable gain devices 14 and 16 may be of any type of variable gain devices such as a step attenuator, an electronic attenuator, a double balanced mixer, a gain controlled amplifier, or a combination gain and attenuation device. For phase shift of 0 to 360 degrees a variable gain device with signal inversion is required. Minicircuits ZAS-3B are preferred due to the linearity over a wide range of frequency inputs. Summing circuit 26 may be of any type ranging from two resistors connected together at output 31 to any type of summing circuit known to those skilled in the art. Merrimac PD20-50 power combiner is preferred.

Quadrature hybrid 12 receives an incoming signal through conductor 10 and outputs two signals one 90 degrees out of phase with the other. These signals are amplified or attenuated through variable gain devices, 14 and 16. The amplified signals are fed to summing circuit 26 which produces a single signal having a phase shift from the original signal received at conductor 10. Part of the signal fed to attenuator 14 is drawn off as a reference signal on conductor 22 at node 24. The reference signal is compared with the output signal on conductor 31 to determine the actual phase shift provided by the present invention. The operator selects the phase shift desired at phase shift selector 40. The information is fed to programmable read only memories 36 and 48 which are programmed with conversion tables that converts the phase shift desired to a digital signal corresponding to the gain at which variable gain devices 14 and 16 are to operate. Programmable read only memory 36 feeds a digital signal to digital-to-analog converter 32 which converts the digital signal to a gain control current to control the gain of variable gain device 14. Programmable read only memory 48 feeds a similar digital signal to digital-to-analog converter 44 which converts the digital signal to a gain control current to control the gain of variable gain device 16.

In operation a signal entering the circuit through conductor 10 is divided by quadrature hybrid 12 into two signals fed to variable gain devices 14 and 16 through conductors 18 and 20, respectively. The signal on conductor 10 will have the form of sin ($\omega t$). The signal on conductor 18 will also be of the form sin ($\omega t$).

This signal is also taken out as a reference signal through conductor 22 at node 24. The signal on conductor 20 will have the form of sin ($\omega t + 90°$) which is cos ($\omega t$). The signal at the output of variable gain device 14 on conductor 28 will have the form of g sin ($\omega t$), where g is the gain of variable gain device 14. The output signal from variable gain device 16 on conductor 30 will have the form of h cos ($\omega t$) where h is the gain of variable gain device 16. The signals from conductor 28 and 30 are fed into summing circuit 26 and the output in conductor 31 is g sin ($\omega t$) + h cos ($\omega t$). The phase difference of the output signal at conductor 31 with respect to the reference signal at conductor 10 is determined by the relationship $\phi = \tan^{-1}(h/g)$. The phase difference, is therefore a function of the ratio of the gains h and g. For a constant amplitude output from summing circuit 26 the quantity $(g^2 + h^2)^{\frac{1}{2}}$ must remain constant as the phase is changed from 0 to 90 degrees. The constant is set at, for example, 1, thus $(g^2 + h^2)^{\frac{1}{2}}$ must equal 1. It follows then that g must equal cos $\phi$ and h must equal sin $\phi$. If for example, a phase shift of 23 degrees is desired, then g is set at 0.92 which is equal to cos 23° and h is set as 0.39 which equal sin 23°. Thus, the expression for the output signal is 0.92 sin ($\omega t$) + 0.39 cos ($\omega t$) which approximately equals 1 sin ($\omega t$ + 23°). To obtain a phase shifting range from 0 to 360 degrees, phase inverting variable gain devices 14 and 16 are used. Variable gain devices 14 and 16 are current controlled electronic attenuators whose output signal amplitude is a function of the control current. A negative control current from digital-to-analog converters 32 and 44 will cause a phase inversion. Thus, the signals at conductors 28 and 30 can be plus or minus g sin ($\omega t$) and plus or minus h cos ($\omega t$), respectively. Therefore, the relative phase, will then vary from 0 to 360 degrees.

Variable gain devices 14 and 16 may be nonlinear as a function of control current and the gains h and g must be calculated for each phase shift increment. Programmable read only memories 36 and 48 can be programmed to calculate the control current necessary for this phase shift selected on phase shift selector 40. Programmable read only memories 36 and 48 calculate a gain current necessary and feed the gain current as a digital signal to digital-to-analog converters 32 and 34. Digital-to-analog converters 32 and 44 will convert the digital representation of gain control current to an analog signal and feed this control current to variable gain devices 14 and 16. Phase shift selector 40 may be of any type such as thumbwheel switches, counters or any devices which can be used to feed an input into programmable read only memories 36 and 48. Phase shift selector 40 simultaneously addresses programmable read only memories 36 and 48 so that the proper gain control current is fed to variable gain devices 14 and 16 through conductors 34 and 46, respectively, to obtain any phase shift desired from 0 to 360 degrees.

The foregoing teaches a phase shifting circuit which can produce a phase shift from 0 to 360 degrees over a broad bandwidth of input signals. The present invention teaches a circuit which produces the phase shift through phase inversion and does not add significant higher harmonics.

The present invention has been described by way of the foregoing preferred embodiment for illustration only and should not be limited thereto but only by the scope of the following claims.

What is claimed is:

1. A phase shifting circuit comprising:
   receiving means for receiving an incoming electrical signal having a frequency selected from a wide band of frequencies and producing two signals one 90 degrees out of phase with the other; having amplitudes approximately equal to said incoming electrical signal
   first gain means for amplitude varying one of said two signals over a continuous range;
   second gain means for amplitude varying an other of said two signals over a continuous range and
   combining means for combining said one amplitude varied signal and said other amplitude varied signal and producing a signal having a phase shift from said incoming signal.

2. The phase shifting circuit according to claim 1 wherein said receiving means includes means for providing a reference signal.

3. The phase shifting circuit according to claim 1 wherein said receiving means comprises a quadrature hybrid circuit.

4. The phase shifting circuit according to claim 3 wherein said first gain means and second gain means comprise phase inverting variable gain devices.

5. The phase shifting circuit according to claim 4 wherein said phase inverting variable gain devices are selected from a group consisting of a step attenuator, electronic attenuator, a combination gain and attenuation device, a double balance mixer, and a gain control amplifier.

6. The phase shifting circuit according to claim 4 additionally including control means for selectively controlling the gain of said first gain means and said second gain means.

7. The phase shifting circuit according to claim 6 wherein said control means includes means for converting a desired phase shift to a gain control current.

8. A method for providing a phase shift to an incoming signal selected from a broad band of frequencies comprising the steps of:
   receiving an incoming signal;
   dividing said incoming signal into a first signal and a second signal 90 degrees out of phase with said first signal;
   selectively gain varying said first signal and second signal over a continuous range and
   combining said gain varied first signal and said gain varied second signal to provide a third signal having a predetermined phase shift from said incoming signal.

9. The method according to claim 8 also including the step of detecting said first signal as a reference signal.

10. A phase shifting circuit comprising:
    first means for dividing an incoming signal having a frequency within a wide band of frequencies into two signals, one 90 degrees out of phase with the other each having an amplitude approximately equal to said incoming signal
    second means for selectively varying the amplitude of one of said two signals and an other of said two signals each over a continuous range; and
    third means for combining said amplitude varied one signal and said amplitude varied other signal to provide a third signal having a predetermined phase shift from said incoming signal.

11. The phase shifting circuit according to claim 10 also including the fourth means for receiving said one signal as a reference signal.

12. The phase shifting circuit according to claim 11 also including fifth means for controlling gain of said second means.

13. An apparatus for providing a phase shift to an incoming signal selected from a broad band of frequencies comprising:
   quadrature hybrid circuit for receiving the incoming signal and dividing it into two signals one 90 degrees out of phase with the other;
   first device for varying the amplitude of said one of two signals over a continuous range
   second device for varying the amplitude of said other of said two signals over a continuous range and
   summing circuit for adding said amplitude varied one signal and said amplitude varied other signal and producing a third signal having a preselected phase difference from said incoming signal.

14. The apparatus according to claim 12 also including a conductor connected to the output of said quadrature hybrid for detecting one signal as a reference signal.

15. The apparatus according to claim 14 also including a first and a second gain control circuit for providing a gain control current to control the gain of said first and said second devices.

* * * * *